(12) United States Patent
Maruyama

(10) Patent No.: US 6,531,944 B1
(45) Date of Patent: Mar. 11, 2003

(54) SURFACE-MOUNT AIR-CORE COIL, ELECTRONIC COMPONENT HAVING THE SAME, AND COMMUNICATION APPARATUS HAVING THE SAME

(75) Inventor: Takashi Maruyama, Kyoto-fu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/618,544

(22) Filed: Jul. 18, 2000

Related U.S. Application Data

(62) Division of application No. 09/042,257, filed on Mar. 13, 1998, now Pat. No. 6,121,866.

(30) Foreign Application Priority Data

Mar. 14, 1997 (JP) .............................................. 9-061529
Feb. 4, 1998 (JP) ............................................ 10-023057

(51) Int. Cl.⁷ ............................................... H01F 27/29
(52) U.S. Cl. ....................... 336/192; 336/65; 336/200
(58) Field of Search ......................... 336/65, 192, 205, 336/225, 222, 223, 200; 338/30

(56) References Cited

U.S. PATENT DOCUMENTS 4,134,091 A * 1/1979 Rogers ........................ 336/61

FOREIGN PATENT DOCUMENTS

| DE | 3615307 | | 11/1987 | ................. 336/205 |
| DE | G9410532.4 | | 8/1994 | ................. 336/205 |
| JP | 402097005 A | * | 4/1990 | |
| JP | 5-198445 | * | 8/1993 | |
| JP | 6-36938 | | 2/1994 | ................. 336/225 |
| JP | 6-369938 | | 2/1994 | ................. 336/225 |
| JP | 6-236816 | | 3/1994 | |
| JP | 6-236816 | | 8/1994 | |
| JP | 6-236818 | * | 8/1994 | |
| JP | 406236816 A | * | 8/1994 | |
| JP | 410022703 A | * | 1/1998 | |
| JP | 410064731 A | * | 3/1998 | |
| WO | 90/13135 | | 1/1990 | ................. 336/205 |
| WO | WO90/13135 | | 1/1990 | ................. 336/205 |

* cited by examiner

Primary Examiner—Elvin Enad
Assistant Examiner—Tuyen T. Nguyen
(74) Attorney, Agent, or Firm—Keating & Bennett, LLP

(57) ABSTRACT

A surface-mount air-core coil has a coil body formed by winding a conductive wire spirally and mount legs formed by folding both ends of the conductive wire horizontally toward the inside. The lower surfaces of the mount legs are positioned below the lower surface of the coil body. The length of the mount legs is set longer than the width of the coil body.

12 Claims, 8 Drawing Sheets

SURFACE-MOUNT AIR-CORE COIL, ELECTRONIC COMPONENT HAVING THE SAME, AND COMMUNICATION APPARATUS HAVING THE SAME

This is a division of 09/042,257, filed Mar. 13, 1998, now U.S. Pat. No. 6,121,866.

BACKGROUND OF THE INVENTION

1. Field of the Invention

The present invention relates to a surface-mount air-core coil mainly serving as an inductor for use at a high frequency, an electronic component having the air-core coil, and a communication apparatus having the air-core coil.

2. Description of the Related Art

A surface-mount air-core coil disclosed in the Japanese Examined Utility Model Publication No. 5-39611 has been known. As shown in FIG. 12 and FIG. 13, the air-core coil 80 has a coil body 82 formed by winding a conductive wire 81 spirally except for both ends thereof and mount legs 83 formed by folding both ends toward the inside at right angles. The coil body 82 has a circular shape and the lower surface 82a thereof is positioned on the same surface as the lower surfaces 83a of the mount legs 83. Therefore, the height H and the width L of the air-core coil 80 is equal to the outer diameter of the coil body 82. The horizontal length $L_1$ of the mount legs 83 is set shorter than the width L.

The air-core coil 80 is accommodated into each pocket 87 of a package tape 86 as shown in FIG. 14 and supplied to a mounting line. A drawing nozzle of a mounting machine (not shown) takes the air-core coil out of each pocket and mounts it at the specified position on a board 85.

When air-core coils having various characteristics, including inductance, are manufactured, the air-core coils have minutely different diameters in the coil bodies and the height H and the width L of each air-core coil become different. Since only one type of the package tape 86 is prepared in terms of manufacturing cost, a small air-core coil may be handled inappropriately with the pocket 87 having fixed dimensions. In other words, if the coil is too small in height compared with the depth of the pocket 87, the coil may rotate in the pocket 87 and become upside down, preventing mounting even if it is taken out. If the coil is small in width compared with the width of the pocket 87, the coil may move in the pocket 87. It becomes difficult to take out the coil, and in addition, erroneous mounting may occur due to a movement in position. It is needless to say that this problem can be eliminated if a package tape having a pocket suited to the size of each air-core coil having certain characteristics is manufactured. However, this is difficult to achieve in terms of cost.

As shown in FIG. 13, in the conventional air-core coil 80, the lower surface 82a of the coil body 82 is positioned ideally on the same plane as the lower surfaces 83a of the mount legs 83. Due to manufacturing errors, however, the lower surfaces 82a and 83a are usually not on the same plane. As shown in FIG. 15, for example, if the lower surface 82a is positioned lower than the lower surfaces 83a, one or both of the mount legs 83 may be erroneously soldered to the circuit board 85. Alternatively, one of the mount legs 83 may be soldered and the air-core coil stands on the board 85, which is a so-called tombstone phenomenon. It is inconvenient for the mount legs 83 to have a small length $L_1$ when soldered.

Furthermore, since the coil body 82 has a circular cross section perpendicular to its axis as shown in FIG. 12, when the coil has a large inductance, it becomes large in diameter and the height H also becomes large.

SUMMARY OF THE INVENTION

Accordingly, it is an object of the present invention to provide a surface-mount air-core coil having good mountability to a circuit board, an electronic component having this air-core coil, and a communication apparatus having this air-core coil.

Another object of the present invention is to provide a surface-mount air-core coil which neither rotates nor moves in position when accommodated into a pocket of a package tape, an electronic component having this air-core coil, and a communication apparatus having this air-core coil.

Still another object of the present invention is to provide a surface-mount air-core coil which can have a low profile while maintaining the same characteristics, including inductance, an electronic component having this air-core coil, and a communication apparatus having this air-core coil.

The foregoing objects are achieved in one aspect of the present invention through the provision of a surface-mount air-core coil comprising: a coil body formed by winding a conductive wire spirally except for both ends; and mount legs formed by folding both ends of the conductive wire horizontally toward the inside in a direction perpendicular to the axis of the coil body, wherein the lower surfaces of the mount legs are positioned below the lower surface of the coil body, and the length of the mount legs is longer than the width of the coil body.

The surface-mount air-core coil having the above structure is soldered, for example, to a circuit board of an electronic component or a communication apparatus by use of the mount legs. Since the mount legs are positioned below the coil body, the mount legs positively contact the circuit board with the lower surface of the coil body not contacting the circuit board even if the outer diameter of the coil body varies in dimension. Problems, such as defective soldering, soldering prevention, and the tombstone phenomenon, do not occur. In addition, when the length of the mount legs is set longer than the width of the coil body, mountability is improved with the sufficiently long legs.

The height of an air-core coil according to the present invention is equal to the sum of the height (outer diameter) of the coil body and the offset of the mount legs. By adjusting the offsets, coils having different outer diameters according to their characteristics, including inductance, can be manufactured at the same height. Even with coils having different outer diameters, when the length of the mount legs is set to a fixed length which is longer than the widths (outer diameters) of the coil bodies, the coils have the same width irrespective of the outer diameters of the coil bodies. Therefore, coils having different outer diameters can be manufactured with a height and a width which are suited to the pockets of a package tape having fixed dimensions. The coils do not move or rotate in the pockets. In other words, when one type of a package tape having pockets suited to a fixed height and a fixed width of air-core coils is prepared, the air-core coils are prevented from rotating and moving in the pockets, positively allowing the coils to be taken out by an automatic mounting machine.

In the surface-mount air-core coil described above, the cross section of the coil body perpendicular to the axis thereof may be formed of two opposing substantially semi-circular sections and substantially straight sections connecting to the substantially semicircular sections. Since the coil body has a flattened shape, the coil has a low profile even with the same inductance. Therefore, an electronic component having this air-core coil and a communication apparatus having this air-core coil can be made to have a low profile. Other features and advantages of the present invention will become apparent from the following description of the invention which refers to the accompanying drawings.

DESCRIPTION OF THE PREFERRED EMBODIMENTS

A surface-mount air-core coil, an electronic component having this air-core coil, and a communication apparatus having this air-core coil according to embodiments of the present invention will be described below by referring to the accompanying drawings. In each embodiment, the same symbols are assigned to the same components or the same portions.

Figure 1:
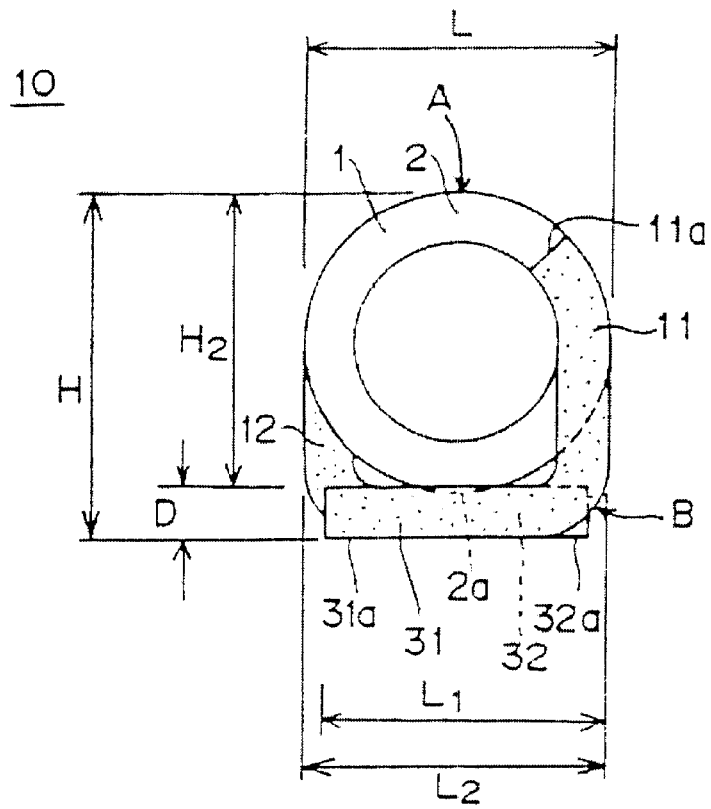
FIG. 1 is an elevation of a surface-mount air-core coil according to a first embodiment of the present invention.
Figure 2:
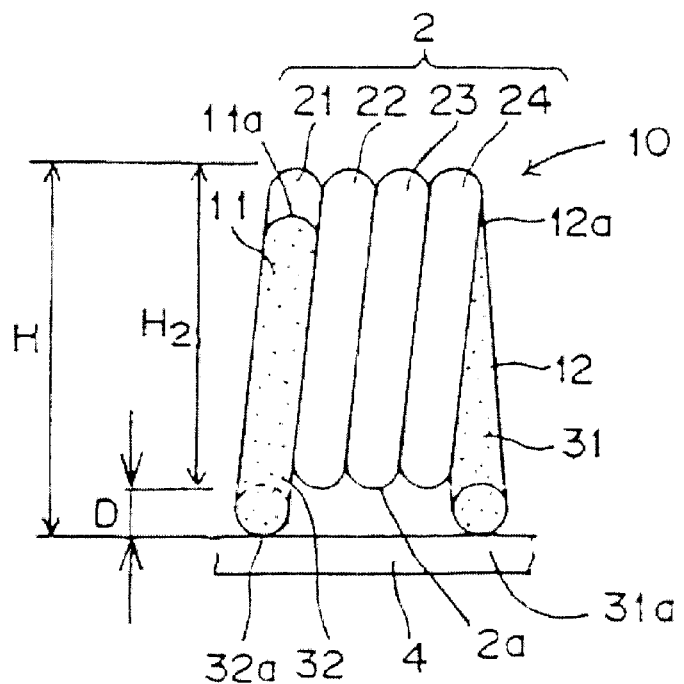
FIG. 2 is a side view illustrating a condition in which the surface-mount air-core coil shown in FIG. 1 is mounted on a circuit board.

As shown in FIG. 1 and FIG. 2, a surface-mount air-core coil 10 according to a first embodiment is made from one conductive wire 1 covered with heatproof resin such as polyurethane, polyester, or polyamide, and has a coil body 2 and mount legs 31 and 32.

The coil body 2 is formed by winding the conductive wire 1 spirally in a plurality of turns except for both ends thereof, and is a set of wheels 21–24 each of which is formed by one turn of the wire. The coil body 2 has a circular cross section (shape of the wheels 21–24) perpendicular to its axis. The height $H_2$ and the width $L_2$ of the coil body 2 are equal to the outer diameter of the coil body 2.

The mount legs 31 and 32 are formed by folding both ends of the conductive wire 1 horizontally toward the inside in the direction perpendicular to the axis of the coil body 2. The lower surfaces 31a and 32a of the mount legs 31 and 32 are positioned lower than the lower surface 2a of the coil body 2 with an offset D of about 0.1 to 0.3 mm. The horizontal portions of the mount legs 31 and 32 are formed such that the length $L_1$ thereof is almost equal to the width $L_2$ of the coil body 2. Therefore, the height H of the coil 10 is the sum of the height $H_2$ of the coil body 2 and the offset D. The width L of the coil 10 is equal to the width $L_2$ of the coil body 2.

At portions from the tips of the mount legs 31 and 32 to almost the upper ends, resin film is removed to allow mounting, and preliminary soldering is applied to portions 11 and 12 to improve solderability for reflow soldering. Ends 11a and 12a of the soldered portions 11 and 12 are positioned between the top A of the coil body 2 and the bent parts B of the mount legs 31 and 32. It may be unnecessary to apply preliminary soldering. Alternatively, solder plating, tin plating, or flux film may be applied to the portions 11 and 12, instead of preliminary soldering.

The air-core coil 10 having the above structure is mounted on a circuit board 4 provided with solder paste by reflow soldering by the use of the drawing nozzle of an automatic mounting machine (not shown). Even if the outer diameters of the wheels 21 to 24 vary due to manufacturing errors, since the lower surfaces 31a and 32a of the mount pegs are disposed lower than the lower surface of the wheels 21 to 24, the lower surfaces 31a and 32a of the mount legs positively contact with the circuit board 4. Therefore, the coil 10 is mounted on the circuit board 4 without problems such as defective soldering, soldering prevention, or the tombstone phenomenon.

The characteristics, including inductance, of the coil 10 correspond to the outer diameter (equal to the height $H_2$ and the width $L_2$) of the coil body 2. The height $H_2$ of the coil body 2 differs according to characteristics. In a plurality of types of the coils 10 having slightly different characteristics, the height $H_2$ of the coil body 2 in each coil is different. The heights $H_2$ of these coils 10 can be set equal, however, by adjusting the offset D.

Figure 3:
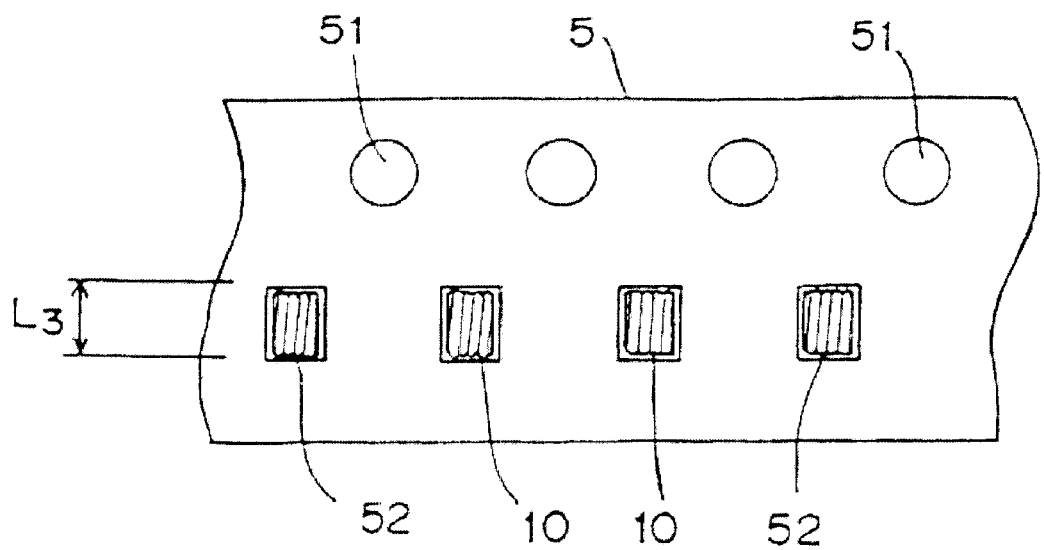
FIG. 3 is a plan of a package tape into which the surface-mount air-core coils shown in FIG. 1 are accommodated.
Figure 4:
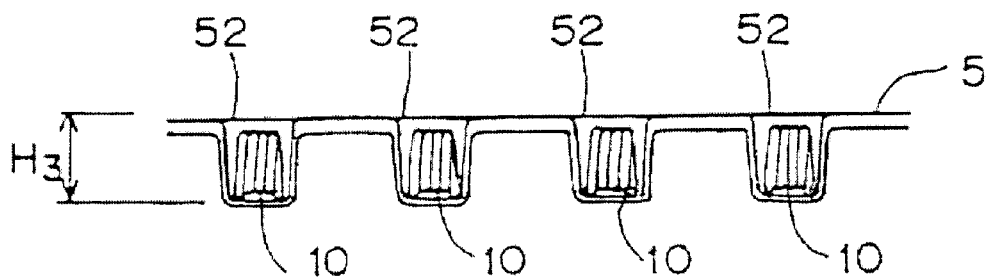
FIG. 4 is a side view of the package tape shown in FIG. 3.

Therefore, when the heights of these coils 10 are matched to the depth $H_3$ of the pockets 52 of a package tape 5 having pilot holes 51 shown in FIG. 3 and FIG. 4, such as an emboss-type and paper-tape-type package tape, even if the package tape 5 has the pockets 52 with a fixed depth $H_3$, these coils 10 are conveyed without rotating upside-down. Therefore, these coils 10 are mounted on the circuit board 4 without producing mounting defects. In other words, the coils 10 having different characteristics can be transported only by the use of the package tape 5 having fixed dimensions without manufacturing package tapes having pockets whose sizes correspond to the characteristics of the coils 10.

Figure 5:
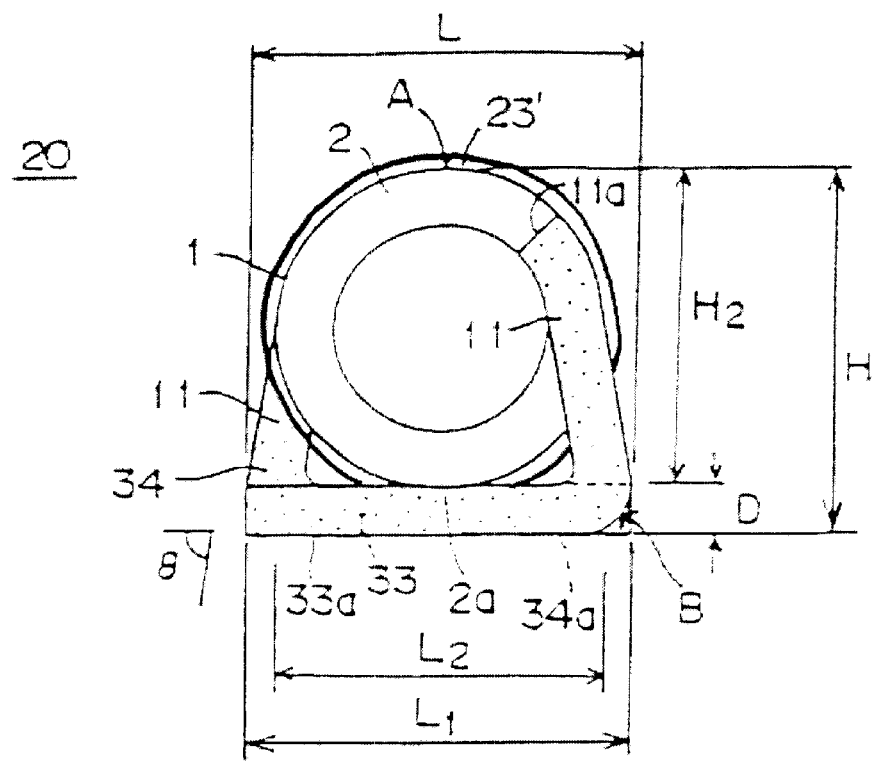
FIG. 5 is an elevation of a surface-mount air-core coil according to a second embodiment of the present invention.
Figure 6:
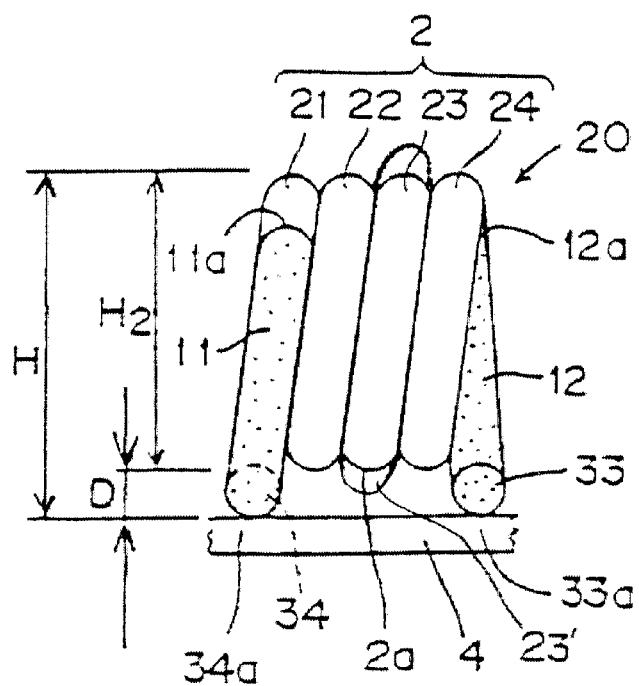
FIG. 6 is a side view illustrating a condition in which the surface-mount air-core coil shown in FIG. 5 is mounted on a circuit board.

As shown in FIG. 5 and FIG. 6, a surface-mount air-core coil 20 according to a second embodiment is provided with mount legs 33 and 34 instead of the mount legs 31 and 32 of the coil 10 shown in FIG. 1.

The mount legs 33 and 34 are formed by folding both ends of a conductive wire 1 horizontally toward the inside in the direction perpendicular to the axis of a coil body 2 with a fold angle θ being set to an acute angle. The lower surfaces 33a and 34a of the mount legs 33 and 34 are positioned lower than the lower surface 2a of the coil body 2. The length $L_1$ of the mount legs 33 and 34 are longer than the width $L_2$ of the coil body 2.

With the mount legs 33 and 34 being provided, the width L of the coil 20 is equal to the length $L_1$ of the mount legs 33 and 34. When a plurality of types of coils 20 having slightly different characteristics are manufactured (e.g., see phantom coil 23' in FIGS. 5 and 6), even if the widths $L_2$ of the coil bodies 2 differ, the length $L_1$ of the mount legs 33 and 34 of each coil is adjusted to set all the widths L of the coils 20 equal. Therefore, the width L of each coil 20 can be matched to the width $L_3$ of the pockets 52 of the package tape 5 (see FIG. 3). Consequently, when the coils 20 are accommodated into the package tape having fixed dimensions and are transported, the coils 20 are prevented from moving, and removal thereof does not become difficult.

Figure 7:
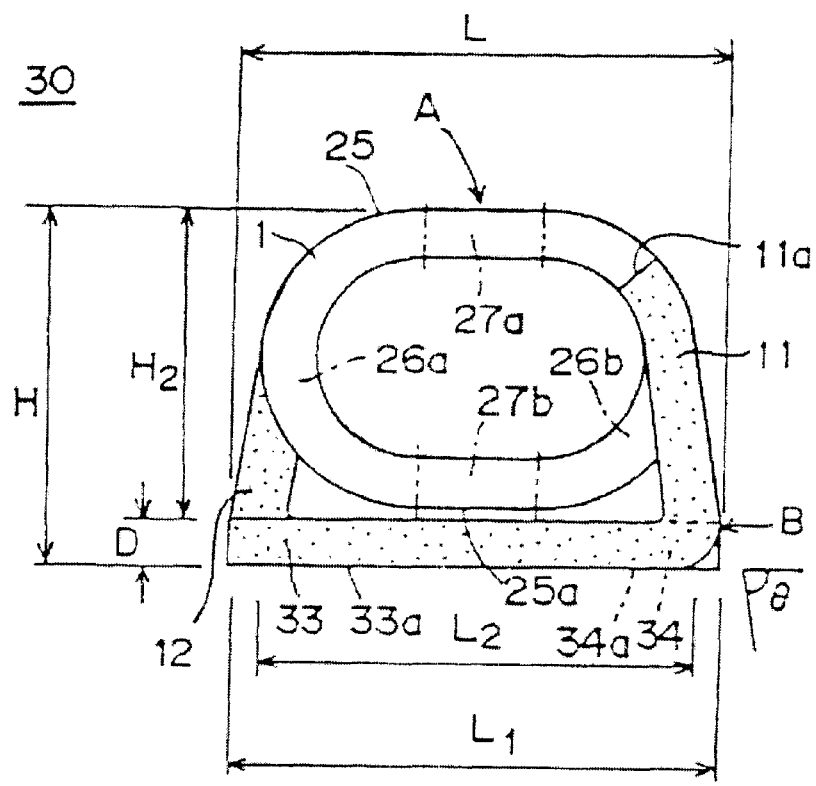
FIG. 7 is an elevation of a surface-mount air-core coil according to a third embodiment of the present invention.

As shown in FIG. 7, a surface-mount air-core coil 30 according to a third embodiment is provided with a coil body 25 having a flattened-circular cross section perpendicular to the axis of the coil body, instead of the coil body 2 of the coil 20 shown in FIG. 5.

The cross section perpendicular to the axis of the coil body 25 is formed of two semicircular portions 26a and 26b and two straight portions 27a and 27b. The opposing semicircular portions 26a and 26b are connected by the straight portions 27a and 27b at the upper ends and the lower ends to form a flattened circle.

Since the coil body 25 is set to have a low profile with the outer diameter thereof being almost maintained, a flattened low-profile air-core coil can be manufactured even with the same inductance. In the present embodiment, the coil 30 may be manufactured such that the length $L_1$ of the mount legs 33 and 34 is equal to the width $L_2$ of the coil body 25. In this case, the width L of the coil 30 becomes equal to the width $L_2$ of the coil body 25.

An electronic component having the surface-mount air-core coil 20 shown in FIG. 5 according to a fourth embodiment will be described below by taking as an example an antenna multiplexing filter used for a mobile communication apparatus such as an automobile phone and a portable phone.

Figure 8:
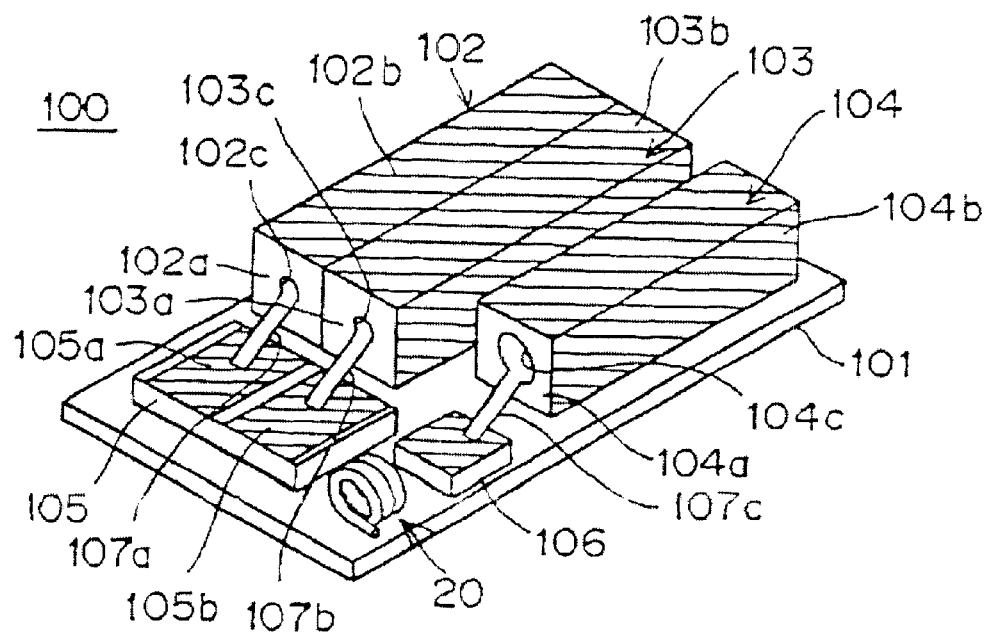
FIG. 8 is a perspective view of an electronic component according to an embodiment of the present invention.

As shown in FIG. 8, an antenna multiplexing filter 100 is formed of a circuit board 101, dielectric resonators 102, 103, and 104 mounted on the circuit board 101, a ceramic substrate 105, a square capacitor 106, and an air-core coil 20. The air-core coil 20 can be mounted on the circuit board 101 without any problems, such as defective soldering, soldering prevention, and the tombstone phenomenon. In some cases, a protective case covers the electrically functional devices 102 to 106 and 20 mounted on the circuit board 101 to protect them from the outside. The circuit board 101 is made from a dielectric material such as resin or ceramic. Circuit conductors (not shown) are formed on the surface of the circuit board 101.

In the dielectric resonators 102, 103, and 104, which are known, almost rectangular-parallelepiped dielectric blocks 102a to 104a are provided with outer conductors 102b to 104b at their outer surfaces and are also provided at their centers with resonator holes 102c to 104c having axes parallel to the longitudinal directions of the blocks. The ceramic substrate 105 is provided with two capacitive electrodes 105a and 105b on its surface. The dielectric resonators 102 and 103 are electrically connected to the capacitive electrodes 105a and 105b, respectively, of the ceramic substrate 105 through connecting terminals 107a and 107b fitted into the resonator holes 102c and 103c, respectively. The dielectric resonator 104 is electrically connected to one of the capacitive electrodes of the square capacitor 106 through a connecting terminal 107c fitted into the resonator hole 104c.

Figure 9:
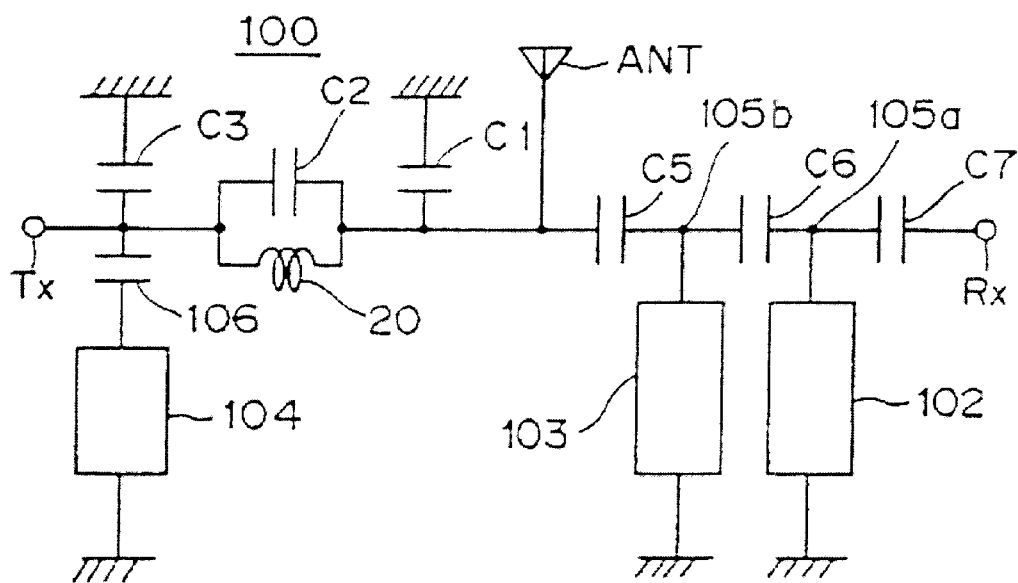
FIG. 9 is an electric equivalent circuit diagram of the electronic component shown in FIG. 8.

The antenna multiplexing filter 100 with the above structure has an electric equivalent circuit shown in FIG. 9. In FIG. 9, C1, C2, and C3 indicate capacitors generated among circuit conductors provided on the circuit board 101. C6 indicates a capacitor generated between the two capacitive electrodes 105a and 105b of the ceramic substrate 105. CS indicates a capacitor generated between the capacitive electrode 105a and the circuit conductors on the circuit board 101. C7 indicates a capacitor generated between the capacitive electrode 105b and the circuit conductors on the circuit board 101.

In this antenna multiplexing filter 100, a transmission signal sent from a transmission circuit system (not shown) to a transmission electrode Tx is output from an antenna electrode ANT through the resonator 104. A signal received from the antenna electrode ANT is output to a receiving circuit system (not shown) from a receiving electrode Rx through the resonators 102 and 103.

Figure 10:
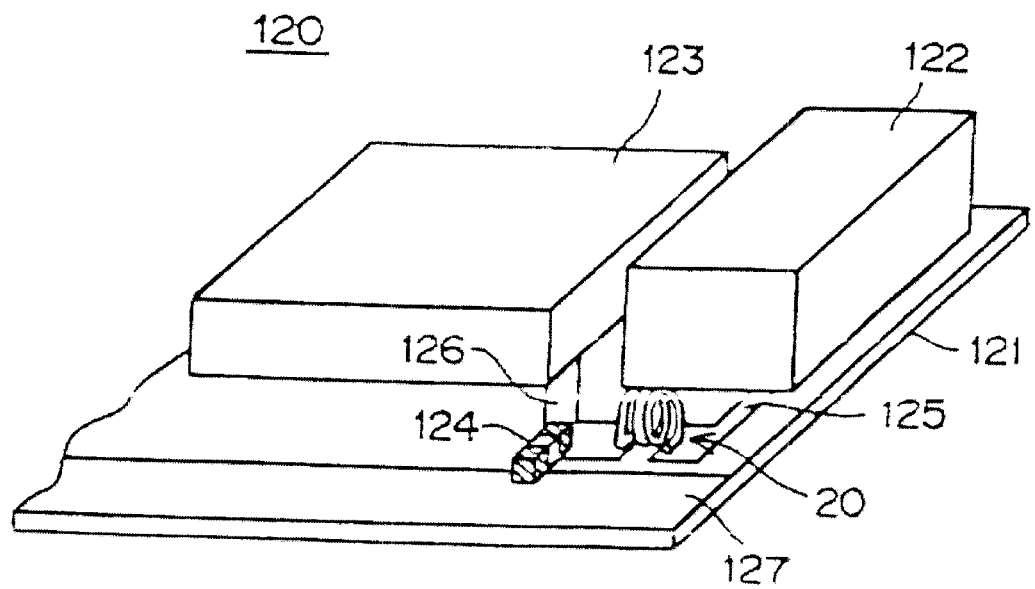
FIG. 10 is a partial perspective view of a communication apparatus according to an embodiment of the present invention.

A communication apparatus having the surface-mount air-core coil 20 shown in FIG. 5, according to a fifth embodiment will be described below by taking a portable phone as an example. FIG. 10 shows an RF section of a portable phone 120. As shown in FIG. 10, an antenna element 122, an antenna multiplexing filter (duplexer) 123, a capacitor 124, an air-core coil 20, and other parts are mounted on a circuit board 121. The air-core coil 20 can be mounted on the circuit board 121 without any problems such as defective soldering, soldering prevention, and the tombstone phenomenon. This air-core coil 20 is used for adjusting the phase of the antenna element 122. In FIG. 10, there are shown circuit conductors 125 and 126 for signals, which are provided on the upper surface of the circuit board 121, and a circuit conductor 127 for the ground.

Figure 11:
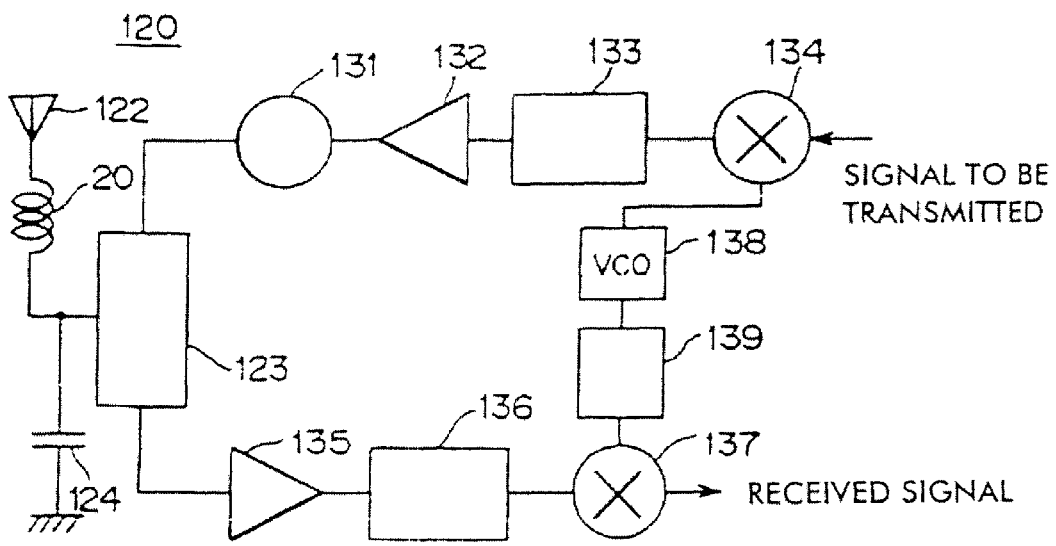
FIG. 11 is an electric circuit block diagram of the communication apparatus shown in FIG. 10.
Figure 12:
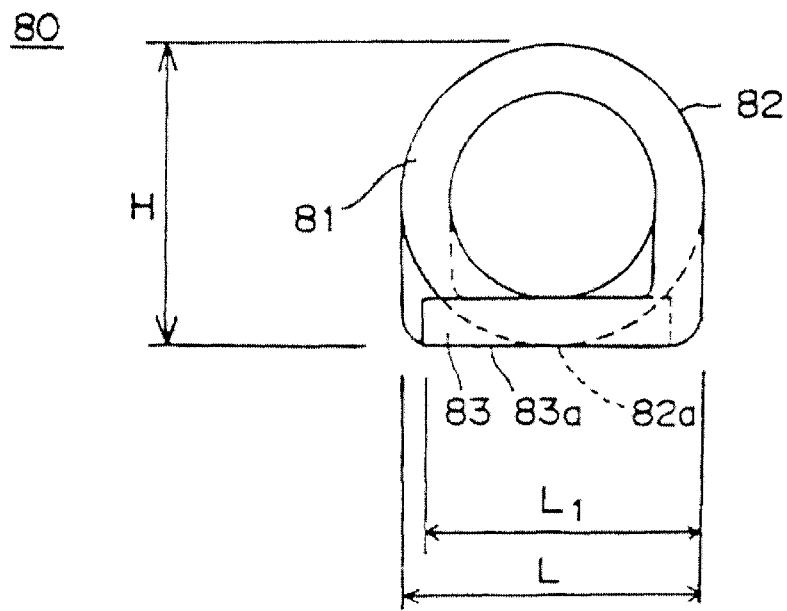
FIG. 12 is an elevation of a conventional surface-mount air-core coil.
Figure 13:
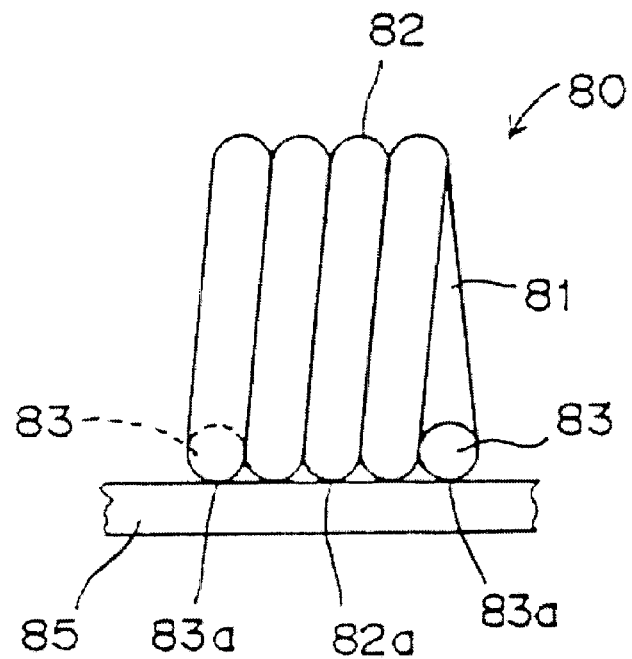
FIG. 13 is a side view illustrating a condition in which the surface-mount air-core coil shown in FIG. 12 is mounted on a circuit board.
Figure 14:
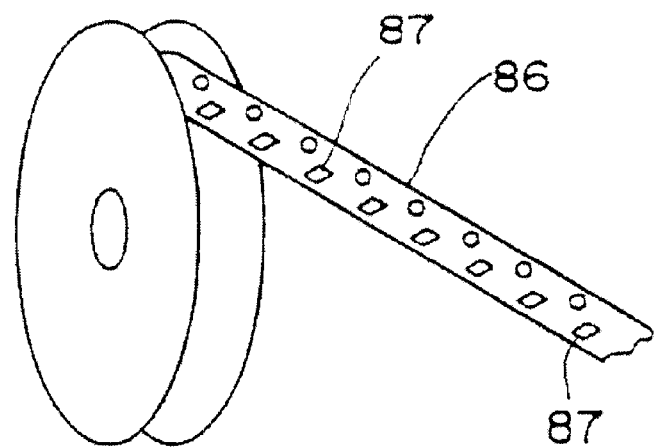
FIG. 14 is a perspective view of a package tape into which the surface-mount air-core coils shown in FIG. 12 are accommodated.
Figure 15:
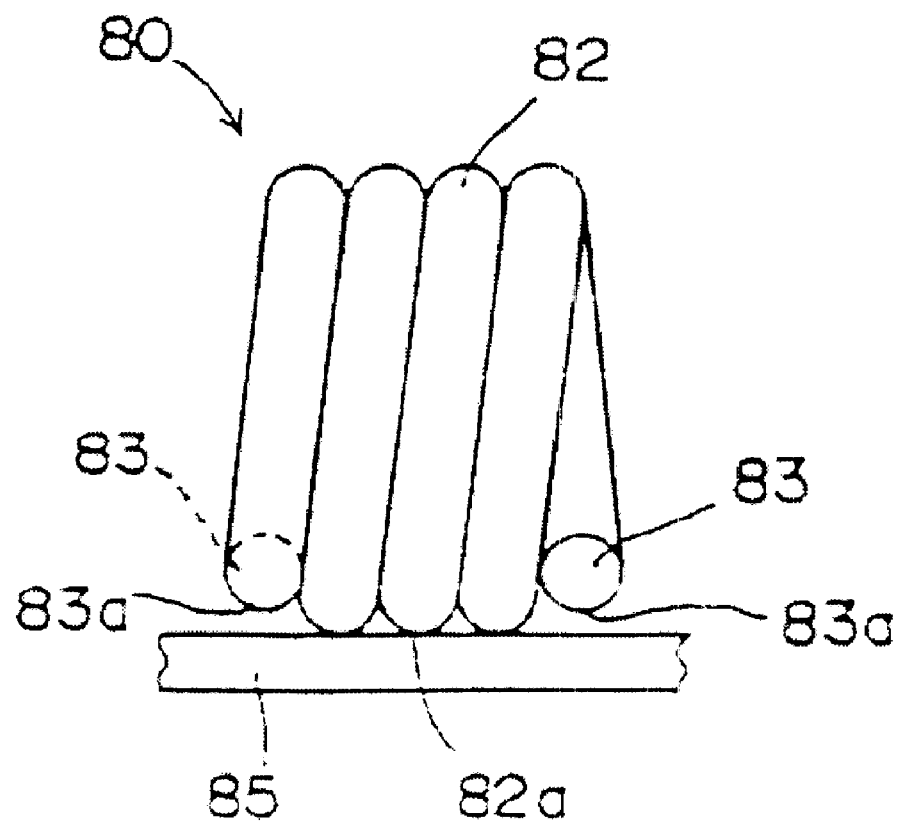
FIG. 15 is a side view illustrating a condition in which the surface-mount air-core coil shown in FIG. 12 is erroneously mounted on a circuit board.

FIG. 11 is an electric equivalent circuit block diagram of the RF section of the portable phone 120 having the above structure. In FIG. 11, there are shown a transmission isolator 131, a transmission amplifier 132, an interstage transmission bandpass filter 133, a transmission mixer 134, a receiving amplifier 135, an interstage receiving bandpass filter 136, a receiving mixer 137, a voltage-controlled oscillator (VCO) 138, and a local bandpass filter 139.

A surface-mount air-core coil, an electronic component having this air-core coil, and a communication apparatus having this air-core coil according to the present invention are not limited to those described in the above embodiments. They can be modified in various ways within the scope of the invention.

While the invention has been particularly shown and described with reference to preferred embodiments thereof, it will be understood by those skilled man in the art that the forgoing and other changes in form and details may be made therein without departing from the spirit of the invention.

What is claimed is:

1. A device, comprising:
   a) a circuit board;
   b) at least one electronic component mounted on said circuit board; and
   c) a surface-mount air-coil mounted on said circuit board, said air-coil comprising:
      (1) a cylindrical coil body having a central axis and a nominal outer diameter, said cylindrical coil body being defined by a spirally wound section of a conductive wire, said section lying between first and second ends of said conductive wire; and (2) said first and second ends of said conductive wire defining first and second straight legs, respectively, said legs extending parallel to one another, an outer edge of each of said legs lying outside the nominal outer diameter of said coil body, the length of each of said legs being greater than said nominal outer diameter of said coil body;

further including first and second connection sections extending from said coil body to aid first and second legs, respectively; wherein said first and second connection sections are straight and form an acute angle with said first and second legs, respectively, as viewed in a plane running perpendicular to said central axis.

2. A device according to claim 1, wherein each of said legs extends from one side of said oil body to the other side of said coil body.

3. A device according to claim 1, wherein said coil body is covered with resin film.

4. A device according to claim 1, wherein said legs are not covered with resin film.

5. A device according to claim 1, wherein each of said legs extends perpendicular to said central axis of said coil body.

6. A device, comprising:

a) a circuit board;

b) at least one electronic component mounted on said circuit board; and c) a surface-mount air-coil mounted on said circuit board, said air-coil comprising:

(1) a cylindrical coil body having a central axis and a nominal outer diameter, said cylindrical coil body being defined by a spirally wound section of a conductive wire, said section lying between opposite ends of said conductive wire; and (2) first and second ends of said conductive wire defining first and second substantially straight legs, respectively, each of said legs extending substantially parallel to one another and substantially perpendicular to said central axis of said coil body, an outer edge of both of said legs lying outside the nominal outer diameter of said coil body, the length of each of said legs being greater than said nominal outer diameter of said coil body;

wherein said coil body is defined by a plurality of individual coils and the diameters of at least some of said individual coils vary slightly from those of at least one of the other individual coils, but the distance from the center of said coil body to said legs as measured along a radius of said coil body is greater than the maximum radius of all of said individual coils.

7. A device, comprising:

a) a circuit board;

b) at least one electronic component mounted on said circuit board; and c) a surface-mount air-coil mounted on said circuit board, said air-coil comprising:

(1) a cylindrical coil body having a central axis and a nominal outer diameter, said cylindrical coil body being defined by a spirally wound section of a conductive wire, said section lying between first and second ends of said conductive wire; and (2) said first and second ends of said conductive wire defining first and second non-spiral-wound legs respectively, each of said legs extending along said circuit board, an outer edge of each of said legs lying outside the nominal outer diameter of said coil body, the length of each of said legs being greater than said nominal outer diameter of said coil body;

further including first and second connection sections extending from said coil body to said first and second legs, respectively; wherein said first and second connection sections form an acute angle with said first and second legs, respectively, as viewed in a plane running perpendicular to said central axis.

8. A device according to claim 7, wherein each of said legs extends from one side of said coil body to the other side of said coil body.

9. A device according to claim 7, wherein said coil body is covered with resin film.

10. A device according to claim 7, wherein said legs are not covered with resin film.

11. A device, comprising:

a) a circuit board;

b) at least one electronic component mounted on said circuit board; and c) a surface-mount air-coil mounted on said circuit board, said air-coil comprising:

(1) a cylindrical coil body having a central axis and a nominal outer diameter, said cylindrical coil body being defined by a spirally wound section of a conductive wire, said section lying between first and second ends of said conductive wire; and (2) said first and second ends of said conductive wire defining first and second non-spiral-wound legs respectively, each of said legs extending along said circuit board, an outer edge of each of said legs lying outside the nominal outer diameter of said coil body, the length of each of said legs being greater than said nominal outer diameter of said coil body; wherein said coil body is defined by a plurality of individual coils and the diameters of at least some of said individual coils vary slightly from those of at least one of the other individual coils, but the distance from the center of said coil body to said legs as measured along a radius of said coil body is greater than the maximum radius of all of said individual coils.

12. A device according to claim 7, wherein each of said legs extends transverse to said central axis of said coil body.

* * * * *